(12) United States Patent
Hwang et al.

(10) Patent No.: US 7,943,931 B2
(45) Date of Patent: May 17, 2011

(54) ARRAY SUBSTRATE HAVING A SUPPORTER FOR A DATA PAD, AND DISPLAY APPARATUS HAVING THE ARRAY SUBSTRATE

(75) Inventors: Seong-Yong Hwang, Yongin-si (KR); Kyoung-Ju Shin, Yongin-si (KR); Weon-Sik Oh, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 561 days.

(21) Appl. No.: 11/354,046

(22) Filed: Feb. 14, 2006

(65) Prior Publication Data

US 2006/0186414 A1 Aug. 24, 2006

(30) Foreign Application Priority Data

Feb. 22, 2005 (KR) .......................... 10-2005-0014653

(51) Int. Cl.
 *H01L 29/04* (2006.01)
(52) U.S. Cl. ...................... 257/59; 257/72; 257/E33.053
(58) Field of Classification Search .................... 257/59, 257/72, E33.053
See application file for complete search history.

(56) References Cited

U.S. PATENT DOCUMENTS

| | | | |
|---|---|---|---|
| 2003/0164919 A1* | 9/2003 | Oh et al. ........................ | 349/149 |
| 2004/0125252 A1* | 7/2004 | Lee et al. ........................ | 349/43 |
| 2006/0006385 A1* | 1/2006 | Park ............................... | 257/59 |
| 2006/0118763 A1* | 6/2006 | Yun et al. ................. | 252/299.63 |
| 2006/0138422 A1* | 6/2006 | Ahn et al. ........................ | 257/59 |
| 2007/0243650 A1* | 10/2007 | Kim et al. ........................ | 438/38 |

* cited by examiner

*Primary Examiner* — Thanh Nguyen
(74) *Attorney, Agent, or Firm* — Cantor Colburn LLP

(57) ABSTRACT

A substrate includes an array area and a data pad area adjacent to the array area. A gate line, a data line and a switching device are formed in the array area of the substrate. A data pad extending from an end of the data line and a supporter provided between the substrate and the data pad are provided in a data pad area to allow the data pad to be placed at a higher position than a passivation layer. Thus, a contact resistance occurring between an anisotropic conductive film and a bump and a contact resistance occurring between the anisotropic conductive film and the data pad are reduced.

17 Claims, 14 Drawing Sheets

ARRAY SUBSTRATE HAVING A SUPPORTER FOR A DATA PAD, AND DISPLAY APPARATUS HAVING THE ARRAY SUBSTRATE

CROSS-REFERENCE TO RELATED APPLICATION

This application claims priority to and the benefit of Korean Patent Application No. 10-2005-0014653, filed on Feb. 22, 2005, which is hereby incorporated by reference for all purposes as if fully set forth herein.

BACKGROUND OF THE INVENTION

1. Field of the Invention

The present invention relates to an array substrate, a display apparatus having the array substrate and a method of manufacturing the array substrate. More particularly, the present invention relates to an array substrate having a reduced contact resistance, a display apparatus having the array substrate and a method of manufacturing the array substrate.

2. Description of the Related Art

A driving printed circuit board processes image data for a liquid crystal display apparatus before the image data is transmitted to a liquid crystal display panel. For a full color display of the liquid crystal display apparatus, signal lines having a gate line and a data line are densely formed in a predetermined area of a thin film transistor substrate of the liquid crystal display (LCD) apparatus. Each of the signal lines has a pad formed at an end thereof. The pad is wider than the respective signal lines.

A driving chip for transmitting a signal is needed for an LCD apparatus to timely apply a driving signal from a driving printed circuit board to the signal lines. The driving chip may be mounted on the liquid crystal display panel by a chip-on-glass method or on a tape carrier package by a chip-on-film method.

In general, the pad is coupled with the driving chip or the tape carrier package through an anisotropic conductive film because of a narrow distance between the pad and an adjacent pad.

The anisotropic conductive film includes an adhesive resin and a plurality of conductive particles distributed in the adhesive resin. A heat compression process is used for the anisotropic conductive film to attach the driving chip or the tape carrier package to the liquid crystal display panel. The conductive particles transmit the signals from the driving chip or the tape carrier package to the pad on the liquid crystal display panel.

However, the LCD panel malfunctions because signals applied to the liquid crystal display panel are distorted due to an increase of a contact resistance between the conductive particles and the liquid crystal display panel.

SUMMARY OF THE INVENTION

The present invention provides an array substrate having a reduced contact resistance, a display apparatus having the array substrate, and a method for manufacturing the array substrate.

Additional features of the invention will be set forth in the description which follows, and in part will be apparent from the description, or may be learned by practice of the invention.

The present invention discloses an array substrate, including a substrate having an array area and a data pad area that is adjacent to the array area; a gate line provided at the array area; a data line provided at the array area, the data line being electrically insulated from the gate line; a switching device coupled with the gate line and the data line; a data pad provided at an end of the data line and formed at the data pad area; and a supporter provided between the data pad and the substrate, the supporter supporting the data pad.

The present invention also discloses a method for manufacturing an array substrate, including patterning a first metal layer to form a gate line and a gate electrode in an array area of a substrate; forming an insulating layer over the gate line and the gate electrode; forming a channel layer on the insulating layer at a data pad area that is adjacent to the array area to form the gate electrode and a supporter; and patterning a second metal layer on the insulating layer corresponding to the array layer to form a data line, a source electrode extending from the data line and crossing the channel layer, a drain electrode spaced apart from the source electrode and crossing the channel layer, and a data pad extending from an end of the data line to cover the supporter.

The present invention also discloses a method for manufacturing an array substrate, including patterning a first metal layer to form a gate line and a gate electrode in an array area of a substrate; forming an insulating layer over the gate line and the gate electrode; sequentially depositing an amorphous silicon layer, an N+ amorphous silicon layer, and a second metal layer on the insulating layer; and patterning the second metal layer, the N+ amorphous silicon layer and the amorphous silicon layer to form a data line, a channel layer crossing the gate electrode, a source electrode extending from the data line and crossing the channel layer, a drain electrode spaced apart from the source electrode and crossing the channel layer at the array area, and a supporter and a data pad on the supporter at a data pad area that is adjacent to the array area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF THE ILLUSTRATED EMBODIMENTS

Figure 1:
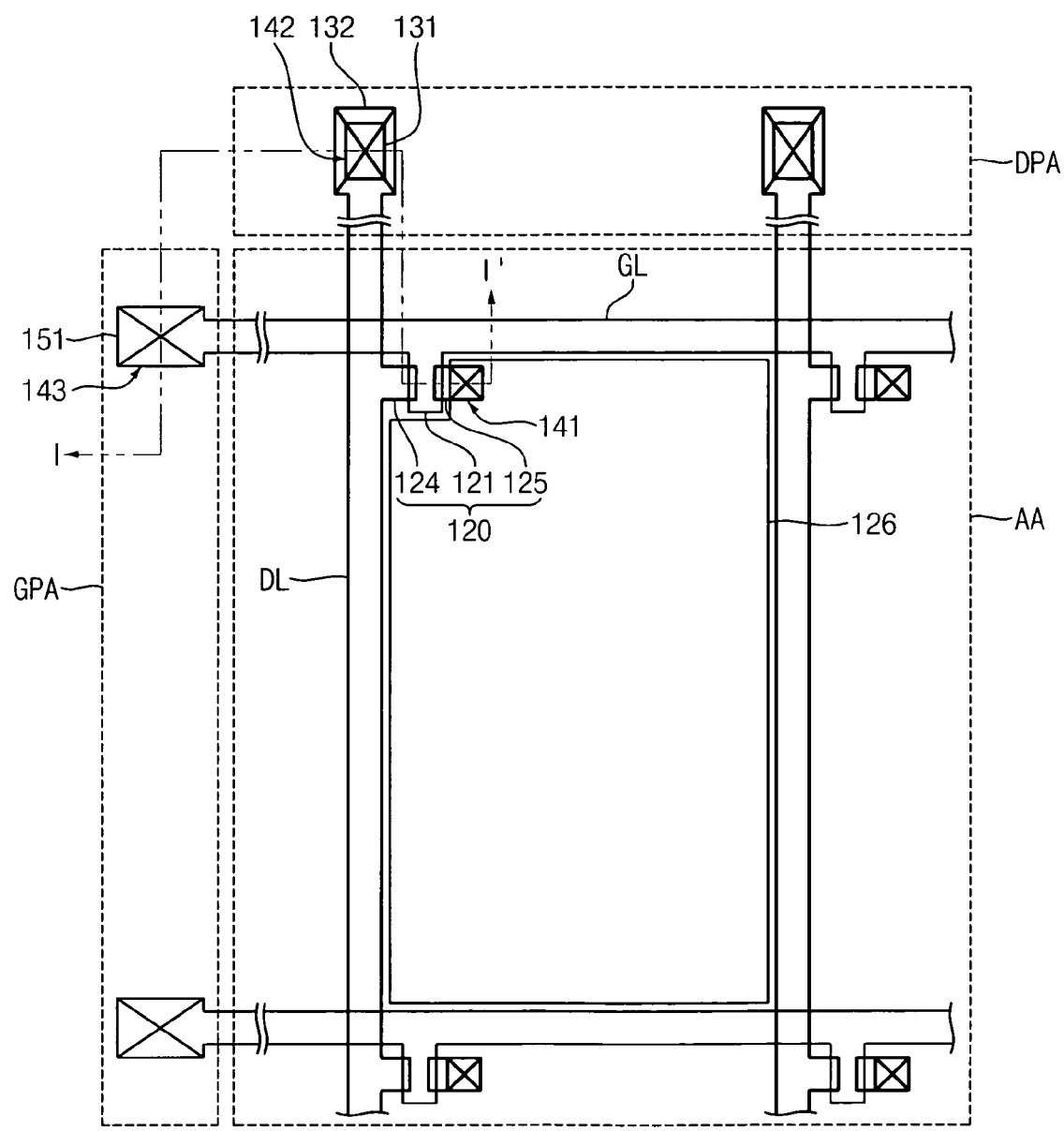
FIG. 1 is a plan view showing an array substrate according to an embodiment of the invention.

It will be understood that when an element or layer is referred to as being "on", "connected to" or "coupled to" another element or layer, the element or layer may be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

The present invention is described below with reference to the accompanying drawings.

Figure 2:
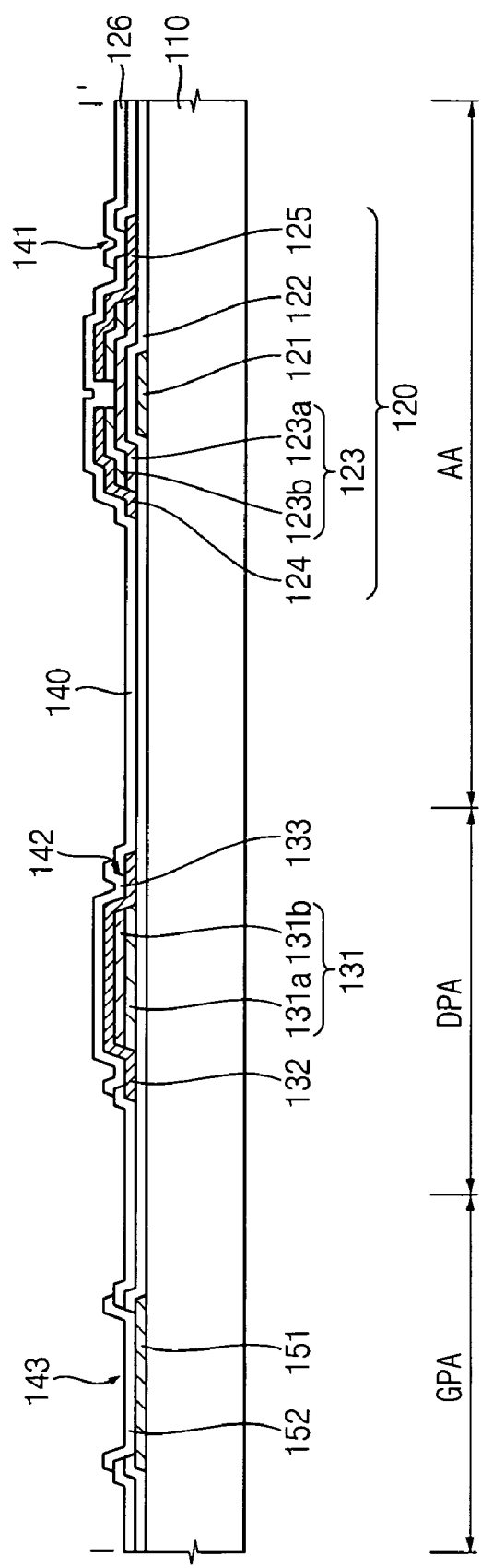
FIG. 2 is a cross-sectional view taken along a line I-I' showing the array substrate in FIG. 1.

FIG. 1 is a plan view showing an array substrate according to an exemplary embodiment of the present invention. FIG. 2 is a cross-sectional view taken along a line I-I' showing the array substrate in FIG. 1.

Referring to FIG. 1 and FIG. 2, an array substrate 100 includes a substrate 110, a gate line GL, a data line DL, a thin film transistor 120, a pixel electrode 126, a data pad 132, and a gate pad 151.

The substrate 110 includes an array area AA, a data pad area DPA adjacent to the array area AA, and a gate pad area GPA. The gate line GL and the data line DL are formed in the array area AA of the substrate 110. The gate line GL extends in a different direction from that of the data line DL and is insulated from the data line DL.

The thin film transistor 120 is electrically connected, e.g., coupled, with the gate line GL and the data line DL. Particularly, the thin film transistor 120 includes a gate electrode 121 branched or extending from the gate line GL, a source electrode 124 branched or extending from the data line DL and a drain electrode 125 spaced apart from the source electrode 124 and electrically connected, e.g., coupled, with the pixel electrode 126.

According to the present embodiment of the invention, the thin film transistor 120 is a bottom gate-type. As such, a gate insulating layer 122 may be formed on the substrate 110 to cover the gate electrode 121, and a channel layer 123 may be formed on the gate insulating layer 122 such that the channel layer 123 overlaps or crosses over the source electrode 124 and the drain electrode 125. The channel layer 123 includes an active layer 123a and an ohmic contact layer 123b. For example, the active layer 123a may include amorphous silicon and the ohmic contact layer 123b may include $N^+$ amorphous silicon.

The data pad 132 which extends from an end of the data line DL, may be formed at the data pad area DPA of the substrate 110. A supporter 131 may be formed between the data pad 132 and the gate insulating layer 122. The supporter 131 may include an amorphous silicon layer 131a and an $N^+$ amorphous silicon layer 131b. In the present embodiment, the data pad 132 covers the supporter 131 and an area of the substrate 110 that is adjacent to the supporter 131.

The gate pad 151, which extends from an end of the gate line GL, may be formed at the gate pad area GPA of the substrate 110.

The array substrate 100 may further include a passivation layer 140 formed over the substrate 110 to cover the data line DL, the source electrode 124, the drain electrode 125, and the gate insulating layer 122. The passivation layer 140 may include a first contact hole 141 to expose the drain electrode 125. The pixel electrode 126 may be formed on the passivation layer 140 adjacent to the thin film transistor 120 and is electrically connected, e.g., coupled, with the drain electrode 125 through the first contact hole 141.

The passivation layer 140 may include a second contact hole 142 through which the data pad 132 is exposed and may include a third contact hole 143 through which the gate pad 151 is exposed. A data pad electrode 133 is formed on the data pad 132 exposed through the second contact hole 142, and a gate pad electrode 152 is formed on the gate pad 151 exposed through the third contact hole 143.

The data pad 132 may be larger than the supporter 131. The second contact hole 142 may be larger than the supporter 131. Thus, the data pad 132 may be placed at a higher position than the passivation layer 140 within the second contact hole 142.

FIGS. 3A, 3B, 3C, 3D, and 3E are views showing a method of manufacturing the array substrate shown in FIG. 2. In FIGS. 3A, 3B, 3C, 3D and 3E, a method of manufacturing the array substrate using five masks is described.

Figure 3A:
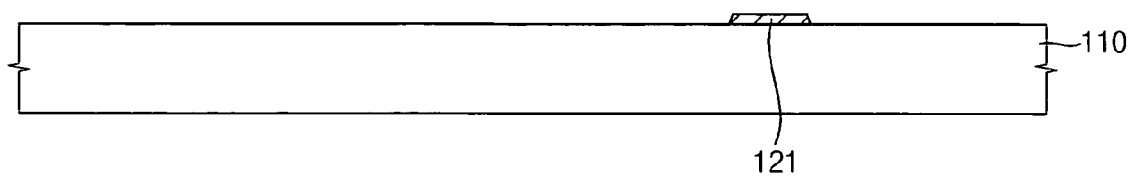
FIGS. 3A, 3B, 3C, 3D, and 3E are views illustrating a method of manufacturing the array substrate shown in FIG. 2.

Referring to FIG. 3A, a first metal layer (not shown), which may include aluminum neodymium (AlNd) may be formed on the substrate 110 using a plasma-enhanced chemical vapor deposition process. The first metal layer may be patterned using a first mask to form the gate electrode 121 on the substrate 110.

Figure 3B:
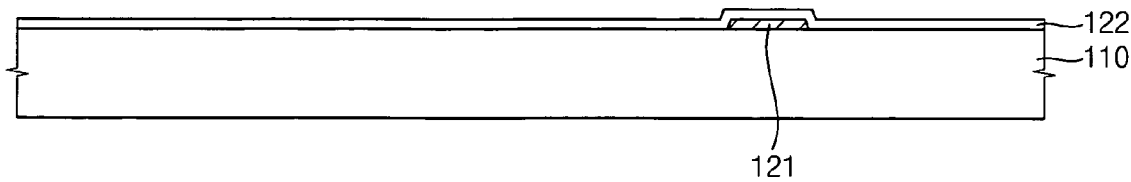

Referring to FIG. 3B, the gate insulating layer 122, which may include silicon nitride (SiNx) or silicon oxide (SiOx), may be formed on the substrate 110 having the gate electrode 121.

Figure 3C:
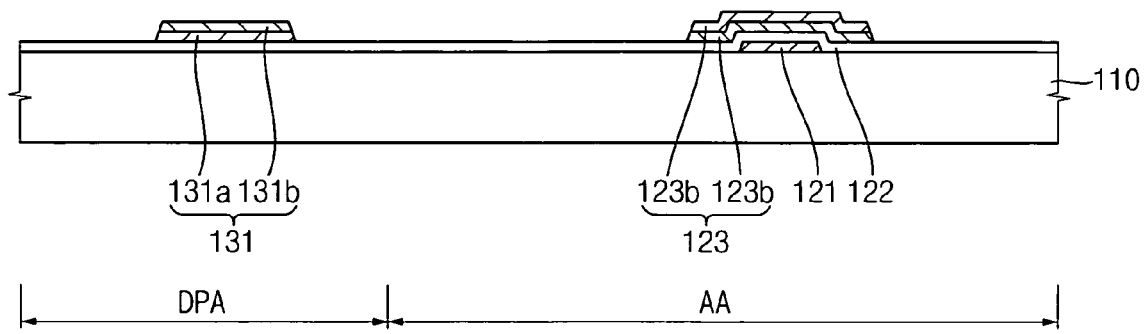

Referring to FIG. 3C, the amorphous silicon layer 131a and the N+ amorphous silicon layer 131b may be sequentially formed on the gate insulating layer 122. The amorphous silicon layer 131a and the N+ amorphous silicon layer 131b may be patterned using a second mask. Accordingly, the channel layer 123 having the active layer 123a and the ohmic contact layer 123b may be formed in the array area AA. The supporter 131 having the amorphous silicon layer 131a and the N+ amorphous silicon layer 131b may be formed in the data pad area DPA. As shown in the embodiment shown in FIG. 3C, the active layer 123a and the ohmic contact layer 123b may overlap the gate electrode 121.

Figure 3D:
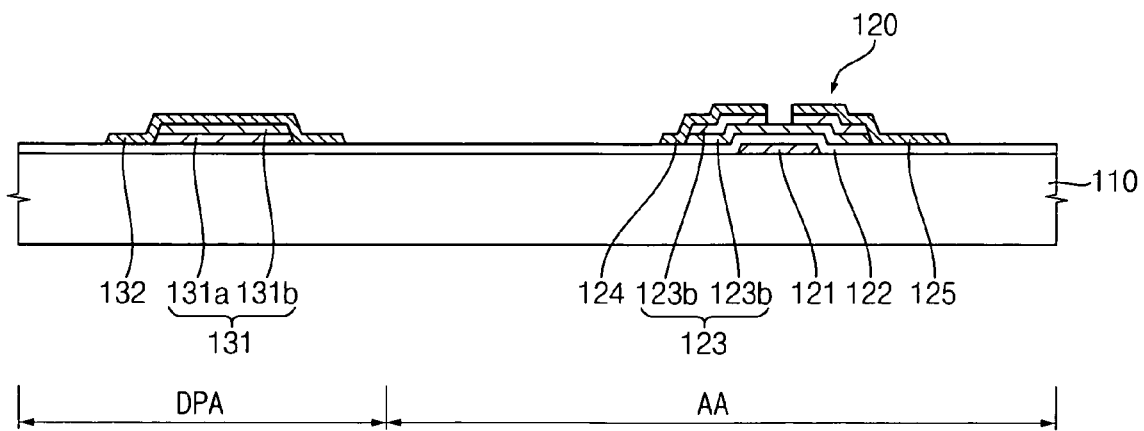

As shown in FIG. 3D, a second metal layer (not shown), which may include chromium (Cr), may be formed on the substrate 110 by a plasma-enhanced chemical vapor deposition process. The second metal layer may be patterned using a third mask to form the source electrode 124 and the drain electrode 125 on the channel layer 123 in the array area AA. The thin film transistor 120 is formed in the array area AA of the substrate 110.

The data pad 132 may be formed on the supporter 131 in the data pad area DPA after the patterning is performed using the third mask. The data pad 132 may be wider than the supporter 131, so that the data pad 132 covers the supporter 131 and the area of the substrate 110 that is adjacent to the supporter 131.

Figure 3E:
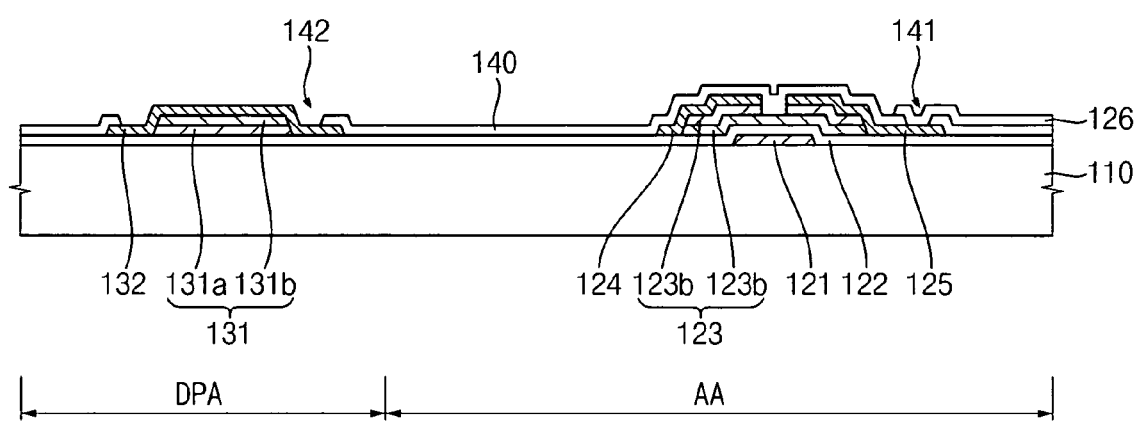

Referring to FIG. 3E, the passivation layer 140, which may include an inorganic insulating layer may be formed on the gate insulating layer 122, the data pad 132, the source electrode 124, and the drain electrode 125. When patterning the passivation layer 140, e.g., the passivation layer 140 may be patterned using a fourth mask, the first contact hole 141 through which the drain electrode 125 is exposed and the second contact hole 142 through which the data pad 132 is exposed may be formed through the passivation layer 140.

Referring to FIG. 2, a transparent conductive layer (not shown) may be formed on the passivation layer 140. The transparent conductive layer may be patterned e.g., using a fifth mask, to form the pixel electrode 126 and the data pad electrode 133 at the array area AA and the data pad area DPA, respectively. The pixel electrode 126 is electrically connected, e.g., coupled, with the drain electrode 125 through the first contact hole 141. The data pad electrode 133 is electrically connected, e.g., coupled, with the data pad 132 through the second contact hole 142. According to the present embodiment, the pixel electrode 126 and the data pad electrode 133 may include indium tin oxide (ITO) or indium zinc oxide (IZO).

Figure 4:
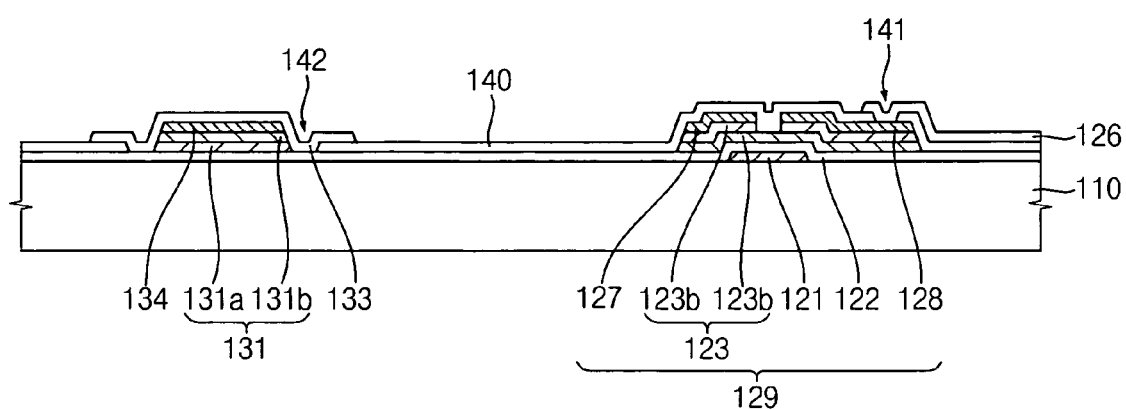
FIG. 4 is a cross-sectional view showing an array substrate according to another embodiment of the invention.

FIG. 4 is a cross-sectional view showing an array substrate according to another embodiment of the invention. In FIG. 4, the same reference numerals refer to the same elements shown in FIG. 2, and thus the detailed descriptions of the same elements are omitted as necessary.

Referring to FIG. 4, an array substrate 100 includes a thin film transistor 129 and a data pad 134 formed thereon. The thin film transistor 129 includes a source electrode 127 and a drain electrode 128 that is spaced apart from the source electrode 127. The source and drain electrodes 127 and 128 may only be formed on the channel layer 123.

The data pad 134 may be substantially the same size as the supporter 131, so that the data pad 134 is substantially formed on only the supporter 131. The passivation layer 140 includes the second contact hole 142, the second contact hole 142 being larger than the data pad 134 and the supporter 131. Thus, the data pad 134 may be placed at a higher position than the passivation layer 140.

The data pad electrode 133 may be formed on the exposed data pad 134 and covers the exposed gate insulating layer 122 and the passivation layer 140 that is adjacent to the second contact hole 142.

Figure 5A:
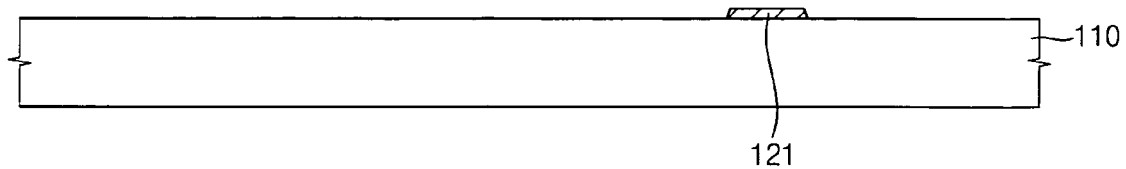
FIGS. 5A, 5B, 5C, 5D and 5E are views illustrating a method of manufacturing the array substrate in FIG. 4.
Figure 5B:

FIGS. 5A, 5B, 5C, 5D, and 5E are views illustrating a method of manufacturing the array substrate shown in FIG. 4. In FIGS. 5A, 5B, 5C, 5D, and 5E, a method of manufacturing the array substrate using five masks is described. The processes shown in FIGS. 5A and 5B are similar to those in FIGS. 3A and 3B, and thus any further description is omitted.

Figure 5C:
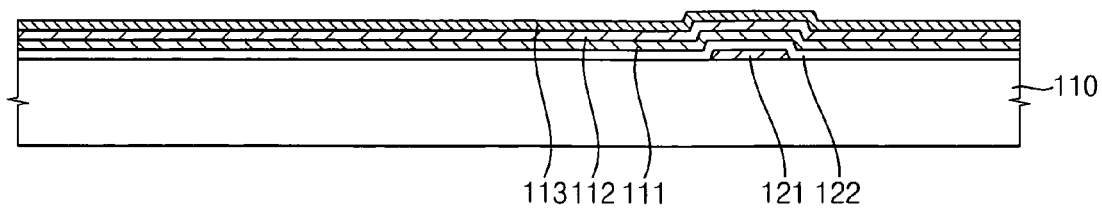
Figure 5D:
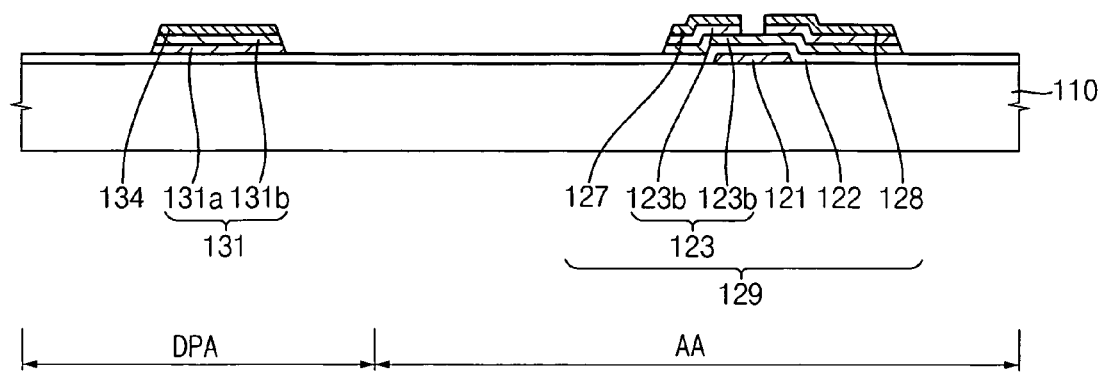

Referring to FIG. 5C, an amorphous silicon layer 111 and an N+ amorphous silicon layer 112 may be sequentially formed on the gate insulating layer 122. A second metal layer 113, which may include chromium (Cr), may be formed on the N+ amorphous silicon layer 112 by a plasma-enhanced chemical vapor deposition process.

The second metal layer 113, the amorphous silicon layer 111 and the N+ amorphous silicon layer 112 are patterned using the second mask. Thus, referring to FIG. 5D, the channel layer 123 having the active layer 123a and the ohmic contact layer 123b may be formed on the gate insulating layer 122 at the array area AA such that the channel layer 123 overlaps the gate electrode 121. The source electrode 127 and the drain electrode 128 may be formed simultaneously on the channel layer 123.

In the data pad area DPA, the supporter 131 may be formed on the gate insulating layer 122 and the data pad 134 may be formed on the supporter 131. Since the second metal layer 113, the N+ amorphous silicon layer 112, and the amorphous silicon layer 111 are substantially simultaneously patterned, the source and drain electrodes 127 and 128 may only be formed on the channel layer 123, and the data pad 134 may be formed only on the supporter 131.

In the present embodiment of the invention, it is understood that the supporter 131 may include only one of the amorphous silicon layer 131a and the N+ amorphous silicon layer 131b.

Figure 5E:
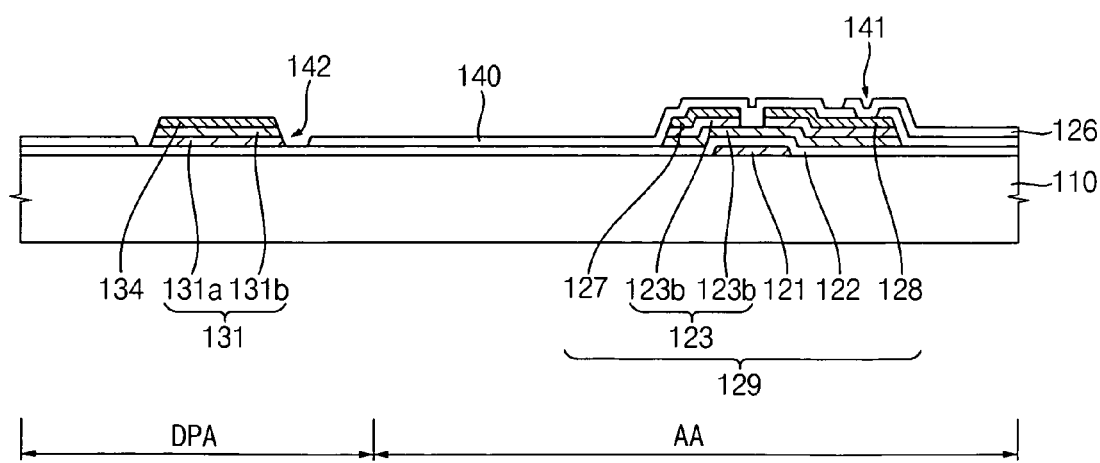

Referring to FIG. 5E, the passivation layer 140, which may include an inorganic insulating layer may be formed on the gate insulating layer 122, the data pad 132, the source electrode 124 and the drain electrode 125. The passivation layer 140 may be patterned using the third mask, and the first contact hole 141 through which the drain electrode 125 is exposed and the second contact hole 142 through which the data pad 132 is exposed are formed therethrough.

The second contact hole 142 may be larger than the data pad 134, so that the data pad 134 and the gate insulating layer 122 adjacent to the data pad 134 are exposed through the second contact hole 142. The second contact hole 142 may also be larger than the supporter 131. Thus, the data pad 134 may be placed at a higher position than the passivation layer 140 at the data pad area DPA.

Referring to FIG. 4, the transparent conductive layer (not shown) may be formed on the passivation layer 140. The transparent conductive layer may be patterned using a fourth mask to form the pixel electrode 126 and the data pad electrode 133 in the array area AA and the data pad area DPA, respectively.

In FIGS. 1, 2, 3A, 3B, 3C, 3D, 3E, 4, 5A, 5B, 5C, 5D, and 5E, it is understood that the supporter 131 may include only one of the amorphous silicon layer 131a and the N+ amorphous silicon layer 131b.

The supporter 131 may include a first metal layer for the gate electrode 121 or the gate line GL, so that the supporter 131 may be substantially simultaneously patterned with the gate electrode 121 or the gate line GL. Thus, the supporter 131 may be formed below the data pad 132 without any additional mask. When forming the supporter 131 below the data pad 132, any layer formed before the data pad 132 may additionally be patterned.

Figure 6:
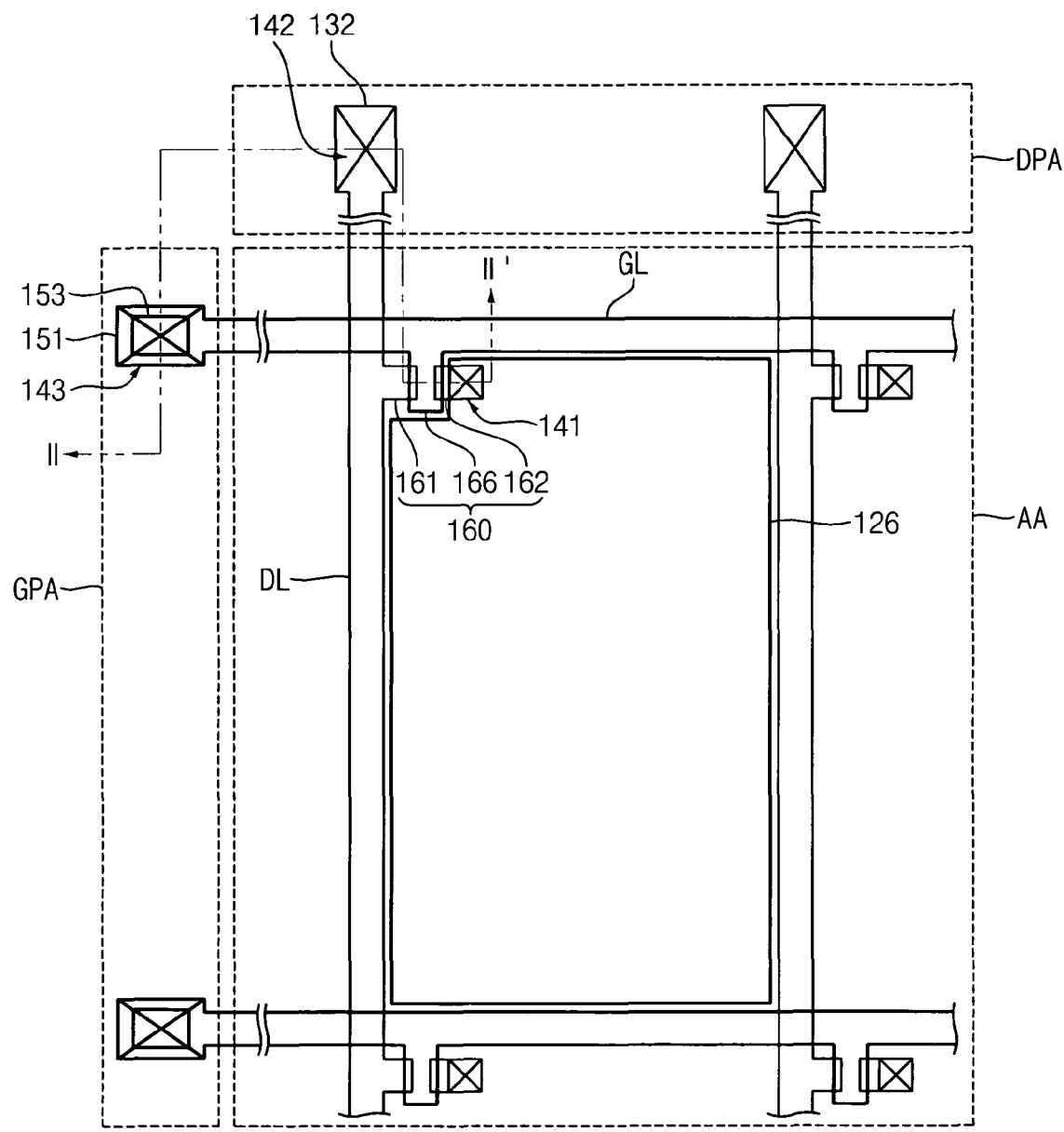
FIG. 6 is a plan view showing an array substrate according to another embodiment of the invention.
Figure 7:
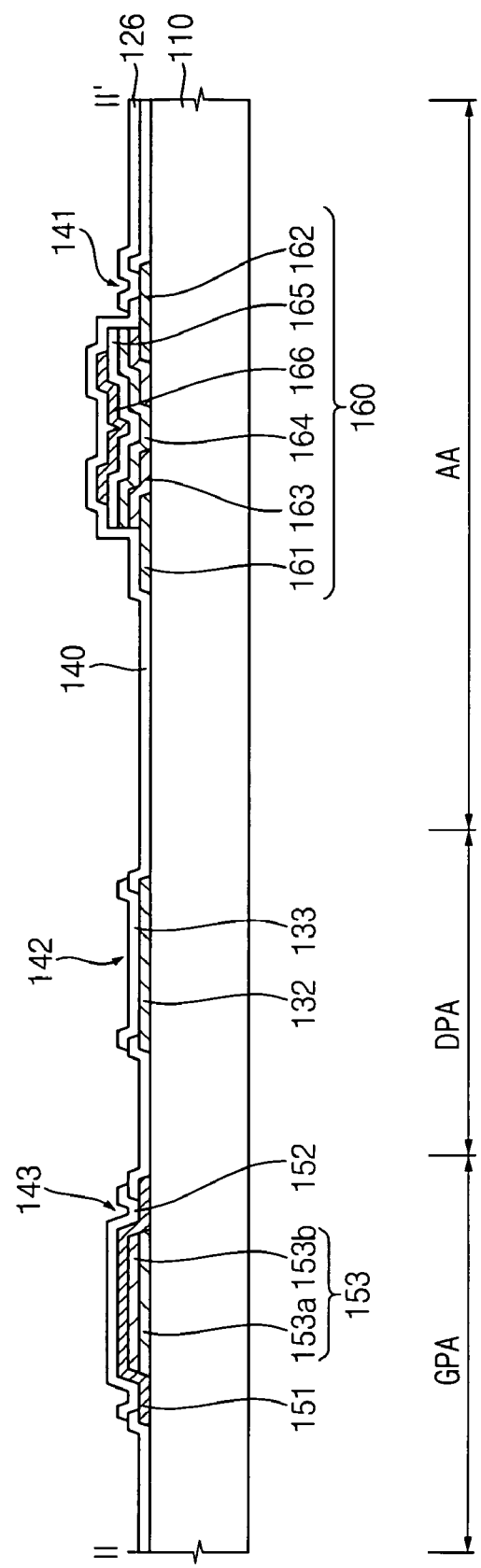
FIG. 7 is a cross-sectional view taken along a line II-II' showing the array substrate shown in FIG. 6.

FIG. 6 is a plan view showing an array substrate according to another embodiment of the invention. FIG. 7 is a cross-sectional view taken along a line II-II' showing the array substrate in FIG. 6.

Referring to FIG. 6 and FIG. 7, an array substrate 100 includes a substrate 110, a gate line GL, a data line DL, a thin film transistor 160, a pixel electrode 126, a data pad 132, and a gate pad 151.

The substrate 110 includes an array area AA, a data pad area DPA provided adjacent to the array area AA, and a gate pad area GPA. The gate line GL, the data line DL, and the thin film transistor 160 are formed in the array area AA.

The thin film transistor 160 includes a source electrode 161, a drain electrode 162, and a gate electrode 166. In the present embodiment, the thin film transistor 160 has a top gate-type.

The source electrode 161 and the drain electrode 162 are spaced apart from each other and formed on the substrate 110. An ohmic contact layer 163 and an active layer 164 may be sequentially formed between the source electrode 161 and the drain electrode 162. The ohmic contact layer 163 and the active layer 164 may extend toward the source electrode 161 and drain electrode 162 and partially overlay or cross the source electrode 161 and drain electrode 162. The active layer 163 may include an amorphous silicon layer, and the ohmic contact layer 164 may include an N⁺ amorphous silicon layer.

An interlayer dielectric layer 165 may be formed on the active layer 164, and the gate electrode 166 may be formed on the interlayer dielectric layer 165.

The data pad 132 extends from the data line DL and is formed on the substrate 110 at the data pad area DPA. The gate pad 151 extends from the gate line GL and is formed at the gate pad area GPA. A gate protruding layer 153 may be formed between the substrate 110 and the gate pad 151. The gate protruding layer 153 may include the amorphous silicon layer 153a and the N⁺ amorphous silicon layer 153b. The gate pad 151 may be formed on the substrate 110 to cover the gate protruding layer 153.

The array substrate 100 may further include a passivation layer 140 formed over the substrate 110. The passivation layer 140 may include a first contact hole 141, a second contact hole 142, and a third contact hole 143 formed therethrough. The pixel electrode 126 may be formed on the passivation layer 140 and is electrically connected, e.g., coupled, with the drain electrode 125 through the first contact hole 141. The data pad electrode 133 may be formed on the data pad 132 that is exposed through the second contact hole 142. The gate pad electrode 152 may be formed on the gate pad 151 that is exposed through the third contact hole 143.

In the present embodiment, the third contact hole 143 is larger than the gate protruding layer 153. Thus, the gate pad 151 may be placed at a higher position than the passivation layer 140 that is adjacent to the third contact hole 143.

Figure 8:
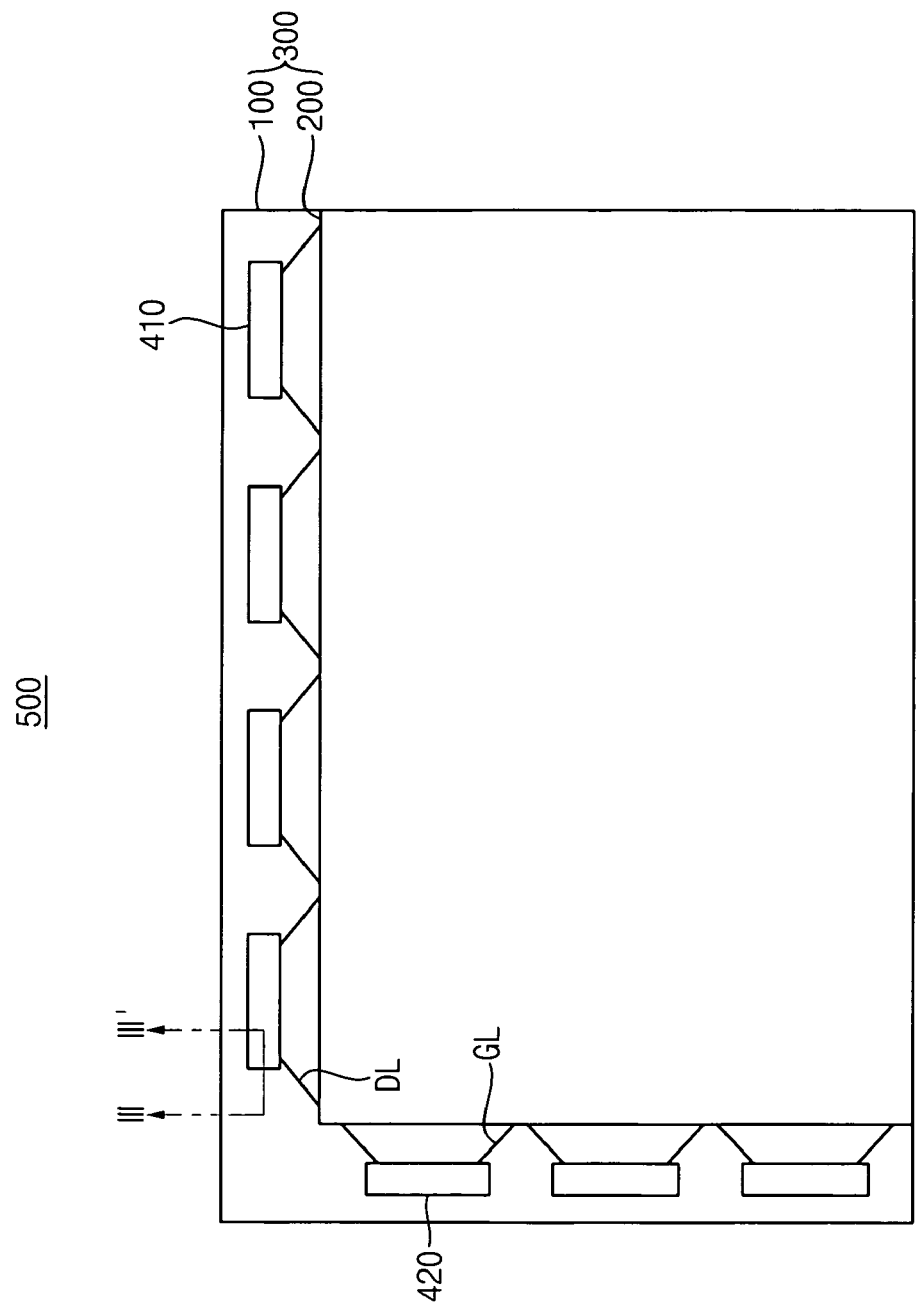
FIG. 8 is a plan view showing a display apparatus according to another embodiment of the invention.
Figure 9:
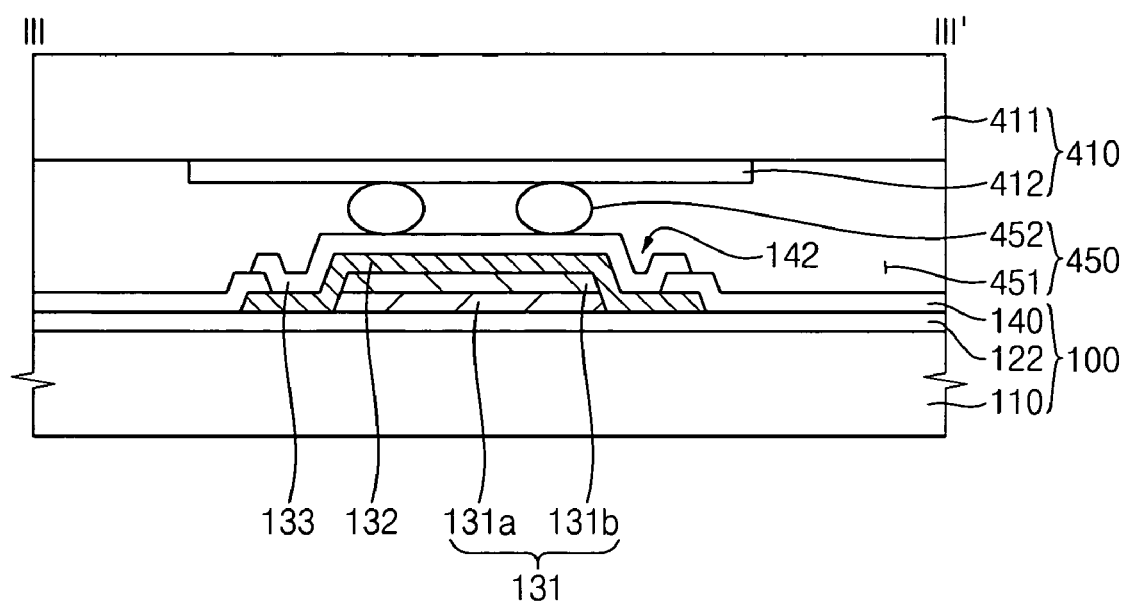
FIG. 9 is a cross-sectional view taken along a line III-III' showing the display apparatus shown in FIG. 8.

FIG. 8 is a plan view showing a display apparatus according to another embodiment of the invention. FIG. 9 is a cross-sectional view taken along a line III-III' showing the display apparatus in FIG. 8.

Referring to FIG. 8, a display apparatus 500 includes a liquid crystal display panel 300, a data driving chip 410, and a gate driving chip 420.

The liquid crystal display panel 300 includes an array substrate 100, a color filter substrate 200, and a liquid crystal layer (not shown). The color filter substrate 200 is coupled with the array substrate 100, and the liquid crystal layer is disposed between the array substrate 100 and the color filter substrate 200.

The data driving chip 410 and the gate driving chip 420 are mounted on or attached with the array substrate 100. The data driving chip 410 is electrically connected, e.g., coupled, with a plurality of data lines DL formed on the array substrate 100. The gate driving chip 420 is electrically connected, e.g., coupled, with a plurality of gate lines GL formed on the array substrate 100.

As shown in FIG. 9, the data driving chip 410 includes a base chip 411 and a bump 412 protruding or extending from the base chip 411 by a predetermined height. The bump 412 is electrically connected, e.g., coupled, with the data pad 132 to transmit a signal from the base chip 411 to the data pad 132.

An anisotropic conductive film 450 may be formed between the data driving chip 410 and the array substrate 100. The anisotropic conductive film 450 may include an adhesive resin 451 and a plurality of conductive particles 452 provided in the adhesive resin 451. The adhesive resin 451 is hardened or solidified when the data driving chip 410 is coupled with the array substrate 100, e.g., by a heat-compression process, thereby attaching the data driving chip 410 with the array substrate 100. The conductive particles 452 electrically connect, e.g., couple, the bump 412 and the data pad 132 by the heat-compression process. Thus, the signal output from the bump 412 is transmitted to the data pad 132 through the conductive particles 452.

When the data pad 132 is placed at a higher position than the passivation layer 140 due to the supporter 131, sufficient pressure is applied to the conductive particles 452 such that the conductive particles 452 deform. As a result, a contact area between the conductive particles 452 and the bump 412 and a contact area between the conductive particles 452 and the data pad 132 may be enlarged, thereby reducing contact resistance between the conductive particles 452 and the bump 412 and contact resistance between the conductive particles 452 and the data pad 132, which prevents signal distortion caused by contact resistance.

Figure 10:
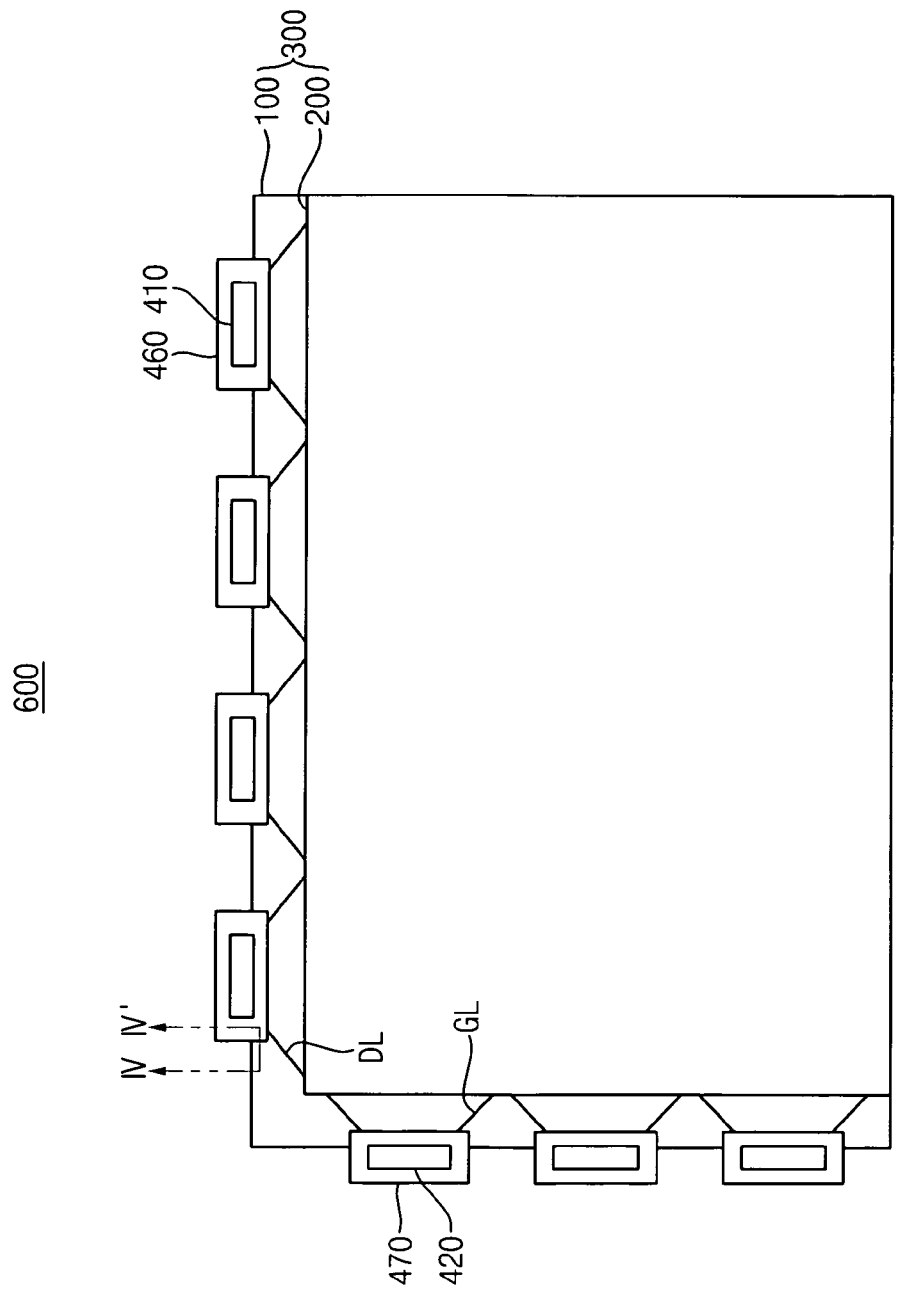
FIG. 10 is a plan view showing a display apparatus according to another embodiment of the invention.
Figure 11:
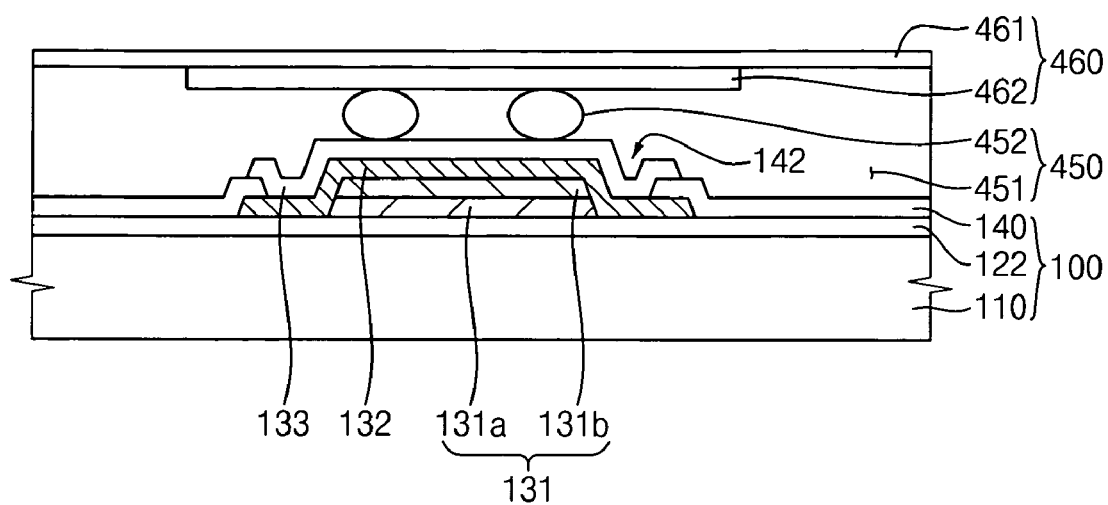
FIG. 11 is a cross-sectional view taken along a line IV-IV' showing the display apparatus shown in FIG. 10.

FIG. 10 is a plan view showing a display apparatus according to another embodiment of the invention. FIG. 11 is a cross-sectional view taken along a line IV-IV' showing the display apparatus in FIG. 10.

Referring to FIG. 10, a display apparatus 600 includes a liquid crystal display panel 300, a first tape carrier package 460, a second tape carrier package 470, and a gate driving chip 420.

The first and second tape carrier packages 460 and 470 are attached with the array substrate 100 by the anisotropic conductive film 450 (refer to FIG. 11). The data driving chip 410 and the gate driving chip 420 are attached with the first tape carrier package 460 and the second tape carrier packages 470, respectively. The signal from the data driving chip 410 is transmitted to the data line DL of the array substrate 100 through the first tape carrier package 460 and the anisotropic conductive film 450. The signal from the gate driving chip 420 is transmitted to the gate line GL of the array substrate 100 through the second tape carrier package 470 and the anisotropic conductive film 450.

As shown in FIG. 11, the first tape carrier package 460 includes a base film 461 and a lead wire 462 provided on the base film 461. The lead wire 462 is electrically connected to the data pad 132.

The anisotropic conductive film may be provided between the first tape carrier package 460 and the array substrate 100. The adhesive resin 451 of the anisotropic conductive film 450 attaches the first tape carrier package with the array substrate 100. The conductive particles 452 in the adhesive resin 451 electrically connect, e.g., couple, the lead wire 462 and the data pad 132, e.g., by a heat-compression process.

In the present embodiment, the data pad 132 may be placed at a higher position than the passivation layer 140 due to the supporter 131, so that sufficient pressure may be applied to the conductive particles 452, thereby deforming the conductive particles 452. As a result, a contact area between the conductive particles 452 and the lead wire 462 and a contact area between the conductive particles 452 and the data pad 132 may be enlarged, thereby reducing contact resistance between the conductive particles 452 and the lead wire 462 and contact resistance between the conductive particles 452 and the data pad 132 which prevents signal distortion caused by contact resistance.

According to the above described embodiments of the invention, the data pad or the gate pad may be formed on the supporter or the gate protruding layer, so that the data pad or the gate pad may be placed at a higher position than an adjacent area thereto.

Thus, for example, when the driving chip or the tape carrier package is attached to the array substrate using the anisotropic conductive film, sufficient pressure is applied to the conductive particles in the anisotropic conductive film, which prevents electrical defects from occurring in the connection area between the pad and the driving chip or in the connection area between the pad and the tape carrier package.

Further, since the conductive particles may be deformed due to the pressure, the contact area between the conductive particles and the bump, the lead wire or the data pad may be increased, which reduces a contact resistance and prevents or substantially reduces signal distortion.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate, comprising:
   a substrate having an array area and a data pad area that is adjacent to the array area;
   a gate line provided at the array area;
   a data line provided at the array area, the data line being electrically insulated from the gate line;
   a switching device coupled with the gate line and the data line;
   a data pad provided at an end of the data line and formed at the data pad area;
   a supporter provided between the data pad and the substrate, the supporter supporting the data pad; and
   a passivation layer covering the gate line, the data line and the switching device, the passivation layer including a contact hole to expose the data pad,
   wherein the data pad is disposed directly on the supporter within the contact hole, and the data pad within the contact hole is disposed at a higher position than the passivation layer adjacent to the contact hole.

2. The array substrate of claim 1, wherein the switching device comprises:
   a gate electrode extending from the gate line;
   an insulating layer provided on the gate electrode;
   a channel layer provided on the insulating layer and overlapping the gate electrode;
   a source electrode extending from the data line and overlapping the channel layer; and
   a drain electrode spaced apart from the source electrode and overlapping the channel layer.

3. The array substrate of claim 2, wherein the channel layer comprises an amorphous silicon layer and an N+ amorphous silicon layer being formed on the amorphous silicon layer.

4. The array substrate of claim 3, wherein the supporter comprises at least one of the amorphous silicon layer and the N+ amorphous silicon layer.

5. The array substrate of claim 4, wherein the data pad is larger than the supporter, the data pad covering the supporter and an area of the substrate that is adjacent to the supporter.

6. The array substrate of claim 4, wherein the data pad only provided on the supporter.

7. The array substrate of claim 1, wherein the contact hole is larger than the supporter.

8. The array substrate of claim 1, further comprising:
   a gate pad extending from the gate line toward a gate pad area that is adjacent to the array area; and
   a gate pad electrode provided on the gate pad and coupled with the gate pad.

9. The array substrate of claim 1, further comprising:
   a pixel electrode coupled with the switching device; and
   a data pad electrode provided on the data pad and coupled with the data pad.

10. The array substrate of claim 1, wherein the data pad is larger than the supporter, the data pad covering the supporter and an area of the substrate that is adjacent to the supporter.

11. The array substrate of claim 1, wherein the data pad is only provided on the supporter.

12. A display apparatus, comprising:
   a display panel comprising an array substrate of claim 1 and an opposite substrate facing the array substrate; and
   a data driving chip transmitting a data signal to the display panel.

13. The display apparatus of claim 12, further comprising:
   an anisotropic conductive film comprising an adhesive resin to attach the data driving chip with the array substrate, the adhesive resin comprising a plurality of conductive particles to couple the data driving chip is with the data pad.

14. The display apparatus of claim 12, further comprising:
   a tape carrier package on which the data driving chip is attached; and
   an anisotropic conductive film comprising an adhesive resin to attach the tape carrier package with the array substrate, the adhesive resin comprising a plurality of conductive particles to couple the tape carrier package with the data pad.

15. The display apparatus of claim 12, wherein the array substrate further comprises a gate pad extending from the gate line toward a gate pad area that is adjacent to the array area.

16. The array substrate of claim 12, wherein the data pad is larger than the supporter, the data pad covering the supporter and an area of the substrate that is adjacent to the supporter.

17. The array substrate of claim 12, wherein the data pad is only provided on the supporter.

* * * * *